(12) United States Patent
Kim et al.

(10) Patent No.: US 9,673,261 B2
(45) Date of Patent: Jun. 6, 2017

(54) ORGANIC LIGHT EMITTING DEVICE

(71) Applicant: LG DISPLAY CO., LTD., Seoul (KR)

(72) Inventors: Min Ki Kim, Paju-si (KR); Han Sun Park, Paju-si (KR); Eui Doo Do, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/651,557

(22) PCT Filed: Dec. 11, 2013

(86) PCT No.: PCT/KR2013/011437
§ 371 (c)(1),
(2) Date: Jun. 11, 2015

(87) PCT Pub. No.: WO2014/092439
PCT Pub. Date: Jun. 19, 2014

(65) Prior Publication Data
US 2015/0318334 A1    Nov. 5, 2015

(30) Foreign Application Priority Data

Dec. 12, 2012  (KR) .................. 10-2012-0144928
Dec. 5, 2013   (KR) .................. 10-2013-0150356

(51) Int. Cl.
*H01L 51/52*   (2006.01)
*H01L 27/32*   (2006.01)
*H01L 51/56*   (2006.01)

(52) U.S. Cl.
CPC ........ *H01L 27/3218* (2013.01); *H01L 27/326* (2013.01); *H01L 27/3213* (2013.01);
(Continued)

(58) Field of Classification Search
CPC . H01L 51/52; H01L 51/5203; H01L 51/5225; H01L 51/5265; H01L 51/5271
See application file for complete search history.

(56) References Cited

U.S. PATENT DOCUMENTS

2004/0187914 A1*  9/2004  Matsuda ............. H01L 31/0687
                                                                136/255
2005/0162075 A1   7/2005  Madathil et al.
(Continued)

FOREIGN PATENT DOCUMENTS

KR   10-2010-0068074 A    6/2010
KR   10-2010-0069337 A    6/2010
KR   10-2011-0109048 A   10/2011

*Primary Examiner* — Phuc Dang
(74) *Attorney, Agent, or Firm* — Dentons US LLP

(57) ABSTRACT

An organic light emitting device utilizing the micro-cavity effect in the RGB subpixel regions while suppressing the micro-cavity effect in the white subpixel region is provided. The organic light emitting device includes a lower substrate, an anode formed on the lower substrate, an organic emission layer formed on the anode, a cathode formed on the organic emission layer, and a reflection decreasing layer formed on at least a portion of the cathode for reducing reflection of the light emitted from the organic emission layer by the cathode to reduce the micro-cavity effect. Such a selective use of the micro-cavity effect in the organic light emitting device improves the color accuracy, the luminance efficiency and the lifespan of the top emission type organic light emitting device.

14 Claims, 5 Drawing Sheets

(52) U.S. Cl.
CPC ...... *H01L 51/5225* (2013.01); *H01L 51/5228* (2013.01); *H01L 51/5231* (2013.01); *H01L 51/5271* (2013.01); *H01L 51/56* (2013.01); H01L 51/5234 (2013.01); H01L 51/5265 (2013.01); H01L 2251/301 (2013.01); H01L 2251/303 (2013.01); H01L 2251/308 (2013.01); H01L 2251/558 (2013.01)

(56) References Cited

U.S. PATENT DOCUMENTS

| | | | |
|---|---|---|---|
| 2006/0238114 A1* | 10/2006 | Hsieh | H01L 51/5271 313/504 |
| 2006/0261727 A1* | 11/2006 | Aziz | H01L 51/5284 313/503 |
| 2007/0015429 A1 | 1/2007 | Maeda et al. | |
| 2007/0126012 A1* | 6/2007 | Omura | H01L 51/5036 257/89 |
| 2008/0122348 A1 | 5/2008 | Jeong et al. | |
| 2009/0051283 A1 | 2/2009 | Cok et al. | |
| 2009/0115326 A1* | 5/2009 | Chan | H05B 33/28 313/504 |
| 2009/0200922 A1* | 8/2009 | Lee | H01L 51/5265 313/504 |
| 2010/0060148 A1 | 3/2010 | Hwang et al. | |
| 2011/0198629 A1 | 8/2011 | Lee et al. | |
| 2012/0248422 A1* | 10/2012 | Mine | H01L 51/5256 257/40 |
| 2013/0153866 A1* | 6/2013 | Chen | H01L 51/0005 257/40 |
| 2013/0292649 A1* | 11/2013 | Moon | H01L 51/5246 257/40 |

* cited by examiner

ORGANIC LIGHT EMITTING DEVICE

TECHNICAL FIELD

Cross-Reference to Related Applications

This application is a 35 U.S.C. §371 National Stage Entry of International Application No. PCT/KR2013/011437 filed Dec. 11, 2013, which claims priority to Korean Patent Application Nos. 10-2012-0144928 filed Dec. 12, 2012 and 10-2013-0150356 filed Dec. 5, 2013, all of which are incorporated by reference for all purposes as if fully set forth herein.

BACKGROUND OF THE INVENTION

Field of the Invention

The present invention relates to an organic light emitting device and a method of manufacturing the organic light emitting device, in particular, relates to an organic light emitting device that may enhance power consumption by improving a light efficiency of an element, and enhance a life span of an element, and a method of manufacturing the organic light emitting device.

Description of the Related Art

An organic light emitting device is a self light-emitting display device, and may be manufactured to be light and thin since a separate light source may not be used unlike a liquid crystal display. In addition, the organic light emitting device has an advantage in terms of power consumption due to a low voltage driving, and is excellent in a color implementation, a response speed, a viewing angle, and a contrast ratio and thus, is being studied as a next generation display.

The organic light emitting device uses color expression schemes including a scheme of forming and using an organic light emitting element that emits red light, green light, and blue light for each pixel region, and a scheme of forming an organic light emitting element that emits white light in all pixel regions, and using a color filter. Between the color expression schemes, whereas the scheme of forming and using an organic light emitting element that emits different colors for each pixel region has difficulty in a fabrication process, the scheme of using a white organic light emitting element and a color filter has an advantage in terms of productivity, a luminance, power consumption, and the like and thus, is being widely studied.

SUMMARY OF THE INVENTION

A top emission type organic light emitting display uses a semi-transparent electrode as a cathode to emit light emitted from an organic emission layer to an upper side. When such a semi-transparent cathode is used, micro-cavity phenomenon naturally occurs in which some portion of light emitted from the organic emission layer is repeatedly reflected by the cathode and the anode. Depending on the optical length between the two reflective surfaces, the light of a predetermined wavelength can be amplified by the constructive interference.

Although the constructive interference of the light can be used to increase the efficiency of the organic light emitting device, it can also cause color accuracy problem by shifting the color of the light emitted from the organic emission layer. For example, in the top emission type white organic light emitting device, some particular wavelength of the white light emitted from the organic emission layer can be amplified. In such a case, the light at the white subpixel region may shifted.

Accordingly, the inventors of the invention found that it is difficult to generate desired white light in the white subpixel region, and conceived an organic light emitting device having a new configuration to resolve the difficulty.

Therefore, an object of the invention is to provide an organic light emitting device capable of enhancing a light efficiency of a device in a pixel structure using a red subpixel region, a green subpixel region, a blue subpixel region, and a white subpixel region, and a method of manufacturing the organic light emitting device.

Another object of the invention is to provide an organic light emitting device capable of enhancing power consumption of a device by improving a light efficiency of an element, and enhancing a life span of an element, and a method of manufacturing the organic light emitting device.

Still another object of the invention is to provide an organic light emitting device to emit desired white light in a white subpixel region when an RGBW pixel structure is applied to a top emission type organic light emitting device, and a method of manufacturing the organic light emitting device.

Objects of the invention are not limited to the objects mentioned above, and other objects not mentioned may be clearly understood by a person skilled in the art from description below.

Accordingly, an aspect of the present disclosure relates to an organic light emitting device having red, green, blue and white subpixel regions with a reflection decreasing layer configured to decrease the light emitted from an organic emission layer by a cathode. In the organic light emitting device, the anode, the organic emission layer, and the cathode are formed on a lower substrate in the stated order. The reflection decreasing layer is formed on a part of the cathode corresponding to the white subpixel of the organic light emitting device. The reflection decreasing layer is configured to reduce the reflection of the light from the organic light emission layer by the cathode in the white subpixel region, thereby reducing the occurrences of the micro-cavity effect in the white subpixel region. The reflection decreasing layer can be disposed on the lower surface, the upper surface, or both the lower and upper surfaces of the cathode corresponding to the white subpixel region.

In an embodiment, the thickness of the anode in the red subpixel region, the green subpixel region and the blue subpixel region may be different so that the optical length between the anode and the cathode is different in the red, green and blue subpixel regions. For instance, the thickness of the anode in the red subpixel region can be a predetermined thickness to define the ideal optical length between the anode and the cathode that causes the micro-cavity effect and amplify a specific wavelength that will pass through the red color filter with minimal filtration. The improved color accuracy and luminance efficiency of the organic light emitting device, in turn, results in the improved power efficiency and the life span of the organic light emitting device.

In an embodiment, an organic light emitting device having a cathode with at least two parts each having different light transmittance rate is provided. The organic light emitting device includes a first electrode disposed on a lower substrate. The first electrode may serve as an anode for the organic light emitting device. An organic emission layer is disposed on the first electrode. Further included in the organic light emitting device is second and third electrodes disposed on the first and second part of the organic light emission layer, respectively. The second and third electrodes may be electrically connected to each other and collectively serve as a cathode for the organic light emitting device. The second electrode and the third electrode have different light transmittances.

In an embodiment, the second electrode and the third electrode are formed so that a light transmittance rate of the third electrode is greater than a light transmittance rate of the second electrode. The first part of the organic emission layer may corresponds to the red, green and blue subpixel regions, while the second part of the organic emission layer may corresponds to the white subpixel region or the organic light emitting device. The third electrode with higher light transmittance rate than the second electrode creates less microcavity effect in the white subpixel region, thereby allowing accurate white light is emitted in the white subpixel region.

In an aspect, there is provided a method of manufacturing an organic light emitting device with a reflection decreasing layer configured to decrease the light emitted from an organic emission layer by a cathode. The method of manufacturing an organic light emitting device includes forming an anode on a lower substrate, forming an organic emission layer on the anode, and forming a cathode and a reflection reduction layer on the organic emission layer. In an embodiment, the first reflection reduction layer is formed on the organic emission layer corresponding to the white subpixel area of the organic light emitting device, and the cathode is formed over the organic emission layer and the reflection decreasing layer. In an embodiment, a second reflection decreasing layer is further disposed on the cathode corresponding to the white subpixel area of the organic light emitting device. Also, in an embodiment, the cathode is formed on the organic emission layer, and the reflection decreasing layer is disposed on the part of the cathode corresponding to the white subpixel area of the organic light emitting device.

BRIEF DESCRIPTION OF DRAWINGS

The above and other aspects, features and other advantages of the present invention will be more clearly understood from the following detailed description taken in conjunction with the accompanying drawings, in which:

FIGS. 1b to 1f are conceptual diagrams illustrating various positions and thicknesses of a reflection decreasing layer of the organic light emitting display illustrated in FIG. 1a;

FIG. 3b is a conceptual diagram describing the organic light emitting display illustrated in FIG. 3a.

DETAILED DESCRIPTION OF THE PREFERRED EMBODIMENT

Figure 1A:
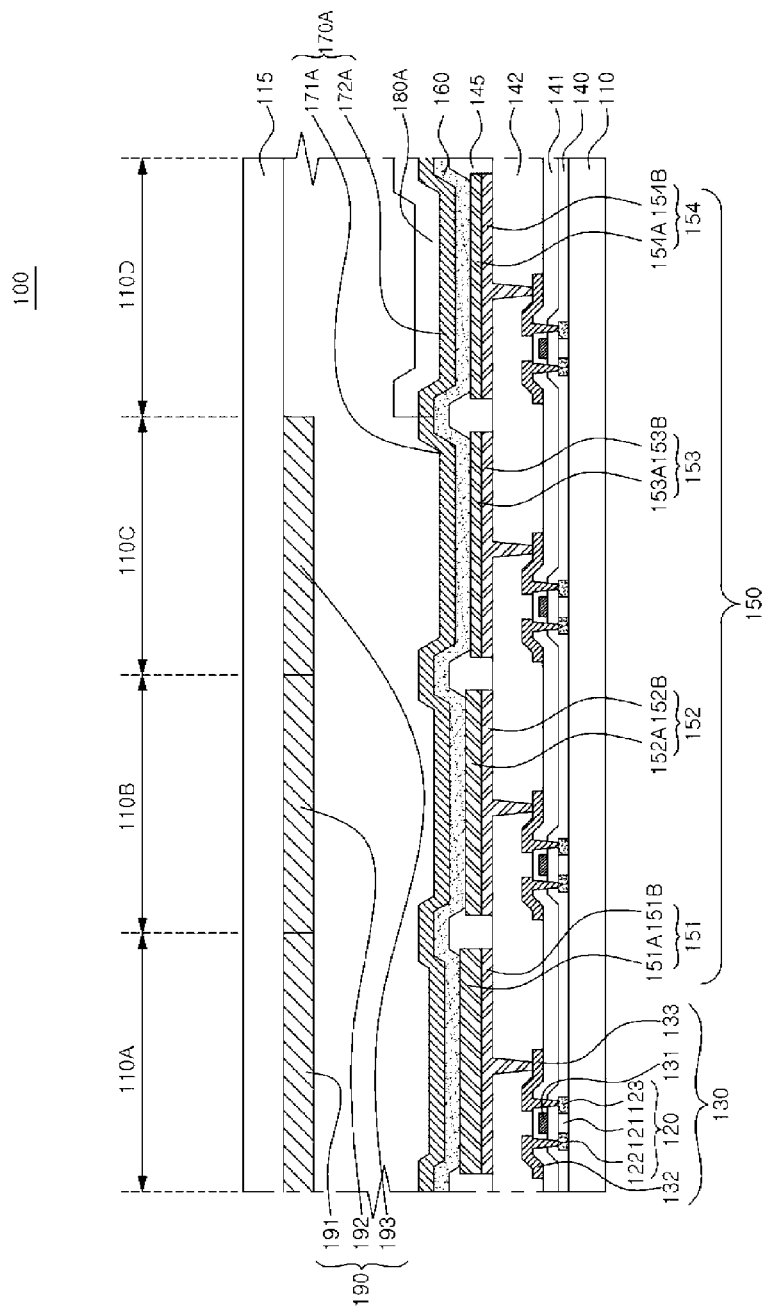
FIG. 1a is a cross-sectional view of a top emission type organic light emitting display including a cathode and a reflection decreasing layer according to embodiments of the invention.

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements.

In this specification, like numbers refer to like elements throughout the description of the drawings.

Although first, second, and the like are used in order to describe various components, the components are not limited by the terms. The above terms are used only to discriminate one component from the other component. Therefore, a first component mentioned below may be a second component within the technical spirit of the present invention.

In the drawings, size and thickness of each element are arbitrarily illustrated for convenience of description, and the present invention is not necessarily limited to those illustrated in the drawings.

In this specification, an organic light emitting device refers to a device that emits light having a predetermined wavelength using an organic emission layer. In this specification, an organic light emitting display corresponds to a case in which the organic light emitting device is used for a display. In this specification, the organic light emitting device is described as the organic light emitting display for convenience of description. However, the invention is not limited thereto, and the organic light emitting display described in this specification may be used for lighting.

In this specification, a top emission type organic light emitting display refers to an organic light emitting display in which light emitted from an organic light emitting element is discharged to a top of the organic light emitting display. Light emitted from the organic light emitting element of the top emission type organic light emitting display of is discharged toward an upper surface of a substrate on which a thin film transistor for driving the organic light emitting display is formed.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or together executed through an association relationship.

Hereinafter, embodiments of the invention are described with reference to accompanying drawings.

FIG. 1a is a cross-sectional view of a top emission type organic light emitting display including a cathode and a reflection decreasing layer according to embodiments of the invention. Referring to FIG. 1a, an organic light emitting display 100 includes a lower substrate 110, an anode 150, an organic emission layer 160, and a cathode 170A.

The lower substrate 110 supporting several elements of the organic light emitting display 100 includes a plurality of subpixel regions. The plurality of subpixel regions emit different colors, respectively. The plurality of subpixel regions include a first subpixel region 110A corresponding to a red subpixel region, a second subpixel region 110B corresponding to a green subpixel region, a third subpixel region 110C corresponding to a blue subpixel region, and a fourth subpixel region 110D corresponding to a white subpixel region. The organic light emitting display 100 according to embodiments of the invention may reduce power consumption, and enhance a light efficiency of the organic light emitting display 100 by employing the fourth subpixel region 110D corresponding to a white subpixel region.

A thin film transistor 130 is formed on the lower substrate 110. The thin film transistor 130 includes an active layer 120, a gate electrode 131, a source electrode 132, and a drain electrode 133. The thin film transistor 130 is formed for each subpixel region on the lower substrate 110, and enables an independent driving for each subpixel region. In this specification, the thin film transistor 130 is illustrated among various thin film transistors that may be included in the organic light emitting display 100 for convenience of description. In addition, in this specification, the thin film transistor 130 is described as a coplanar thin film transistor. However, an inverted staggered thin film transistor may be used.

The active layer 120 is formed on the lower substrate 110. The active layer 120 includes a channel region 121, and a source region 122 and a drain region 123 disposed on both sides of the channel region 121. A gate insulating film 140 is formed on the active layer 120 to insulate the active layer 120 from the gate electrode 131. As illustrated in FIG. 1a, when the gate insulating film 140 is formed over the entire surface of the lower substrate 110, the gate insulating film 140 is formed to include a contact hole that opens a portion of the active layer 120, and the contact hole opens a portion of the source region 122 and the drain region 123. The gate electrode 131 is formed on the gate insulating film 140. An interlayer insulating film 141 is formed on the gate electrode 131. The interlayer insulating film 141 is formed to include a contact hole that opens a portion of the active layer 120, and the contact hole opens a portion of the source region 122 and the drain region 123 of the active layer 120. The source electrode 132 and the drain electrode 133 are formed on the interlayer insulating film 141. The source electrode 132 and the drain electrode 133 are electrically connected to the source region 122 and the drain region 123 of the active layer 120 through the contact holes formed in the interlayer insulating film 141 and the gate insulating film 140, respectively. In order to enhance a light emitting efficiency of an organic light emitting element, a planarization layer 142 is formed on the thin film transistor 130 to flatten an upper side of the lower substrate 110. The planarization layer 142 is formed to include a contact hole exposing the drain electrode 133.

An organic light emitting element including the anode 150, the organic emission layer 160, and the cathode 170A is formed on the lower substrate 110. The organic light emitting element is driven such that a hole supplied from the anode 150 and an electron supplied from the cathode 170A combine in the organic emission layer 160 to emit light, thereby forming an image. The organic light emitting display 100 is an independently driven display, and is driven for each subpixel region. Therefore, the thin film transistor 130 and the organic light emitting element described above are disposed for each subpixel region and thus, the thin film transistor 130 disposed for each subpixel region may independently drive the organic light emitting element.

The anode 150 is formed on the planarization layer 142. The anode 150 may be connected to the drain electrode 133 of the thin film transistor 130 through the contact hole formed in the planarization layer 142. The anode 150 is formed using a conductive material having a high work function to supply a hole, and the anode 150 includes transparent conductive layers 151A, 152A, 153A, and 154A having a high work function.

As illustrated in FIG. 1a, when the organic light emitting display 100 is the top emission type organic light emitting display, the anode 150 includes reflective layers 151B, 152B, 153B, and 154B formed on a lower side of the transparent conductive layers to discharge light emitted from the organic emission layer 150 to an upper side of the organic light emitting display 100. The reflective layers 151B, 152B, 153B, and 154B are formed as conductive layers excellent in a reflectance.

The anode 150 is separately formed for each subpixel region. In this specification, the anode 150 formed in a region corresponding to the first subpixel region 110A is defined as a first anode 151, the anode 150 formed in a region corresponding to the second subpixel region 110B is defined as a second anode 152, the anode 150 formed in a region corresponding to the third subpixel region 110C is defined as a third anode 153, and the anode 150 formed in a region corresponding to the fourth subpixel region 110D is defined as a fourth anode 154. In addition, as described above, the first anode 151 includes the transparent conductive layer 151A and the reflective layer 151B, the second anode 152 includes the transparent conductive layer 152A and the reflective layer 152B, the third anode 153 includes the transparent conductive layer 153A and the reflective layer 153B, and the fourth anode 154 includes the transparent conductive layer 154A and the reflective layer 154B. A bank layer 145 is formed on the anode 150. The bank layer 145 is formed to divide adjacent subpixel regions.

The organic emission layer 160 emitting white light is formed on the anode 150. The organic emission layer 160 may be formed in a single stack structure or a multi-stack structure as a stack structure for emitting white light. The organic emission layer 160 may be formed in a stack structure of a fluorescent material, a phosphorescent material, and a fluorescent material, a stack structure of a phosphorescent material, or a stack structure of a fluorescent material and a phosphorescent material.

The cathode 170A is formed on the organic emission layer 160. The cathode 170A is formed in the entire region of the organic emission layer 160. That is, the cathode 170A is connected to a separate voltage wire to apply the same voltage to all subpixel regions, and thus is not patterned for each subpixel region, and is formed to cover the entire region of the organic emission layer 160.

The cathode 170A supplies an electron and thus, is formed using a material having a high electrical conductivity and a low work function, that is, a material for a cathode. As illustrated in FIG. 1a, when the organic light emitting display 100 is the top emission type organic light emitting display, the cathode 170A is formed using a significantly thin metallic material having a low work function. For example, when the cathode 170A is formed using a metallic material having a low work function, the cathode 170A may be formed by a metallic material such as silver (Ag), titanium (Ti), aluminum (Al), molybdenum (Mo), or an alloy of Ag and Mg at a thickness of several hundred Å or less, for example, 200 Å or less, and more preferably between about 100 Å and 200 Å. In this case, the cathode 170A substantially corresponds to a semi-transparent layer. The light transmittance of the cathode 170A can be decreased if the thickness is more than 200 Å, which in turn reduces the luminance efficiency of the organic light emitting device. Also, the surface resistance of the cathode 170A can become undesirably high if the thickness of the cathode 170A is less than 100 Å. Accordingly, in the preferred embodiment, the thickness of the cathode 170A is about 150 Å. In addition, the cathode 170A may be formed with carbon nanotube and/or graphene may be used in conjunction with the metallic material described above for increased light transmittance rate and the reduced surface resistance.

A color filter 190 is disposed on the lower substrate 110. The color filter 190 includes a first color filter 191, a second color filter 192, and a third color filter 193 disposed to correspond to the first subpixel region 110A, the second subpixel region 110B, and the third subpixel region 110C. Each of the first color filter 191, the second color filter 192, and the third color filter 193 is a color filter for displaying a predetermined color. For example, each of the first color filter 191, the second color filter 192, and the third color filter 193 may be a color filter for displaying any one of red, green, and blue. In FIG. 1a, the first color filter 191 is defined as a red color filter, the second color filter 192 is defined as a green color filter, and the third color filter 193 is defined as a blue color filter for convenience of description. The fourth subpixel region 110D corresponds to the white subpixel region and thus, a color filter is not disposed. When white light emitted from an organic light emitting element disposed to correspond to each of the first subpixel region 110A, the second subpixel region 110B, and the third subpixel region 110C passes through the color filter 190, light having various colors may be displayed in the organic light emitting display 100.

The upper substrate 115 is disposed on the lower substrate 110. The upper substrate 115 is disposed to face the lower substrate 110, and may be formed using the same material as a material of the lower substrate 110.

A micro-cavity indicates that light having a predetermined wavelength is amplified by constructive interference when light is repeatedly reflected between two layers spaced apart by an optical path length. As illustrated in FIG. 1a, when the organic light emitting display 100 is the top emission type organic light emitting display, the anode 150 where the reflective layers 151B, 152B, 153B, and 154B, and the transparent conductive layers 151A, 152A, 153A, and 154A are stacked is disposed on a lower part of the organic light emitting element, and the cathode 170A including a significantly thin metallic material and corresponding to a semi-transparent layer is disposed on an upper part of the organic light emitting element. Light emitted to the lower part of the organic light emitting element of light emitted from the organic light emitting element is reflected on the anode 150, and travels to the upper part of the organic light emitting element. Light emitted to the upper part of the organic light emitting element and light reflected on the anode 150 in the organic light emitting element travel to the cathode 170A. A portion thereof is discharged to the outside, and the other portion thereof is reflected to travel to the anode 150 again. Therefore, light repeatedly reflected between the anode 150 and the cathode 170A is generated, and light having a predetermined wavelength may be amplified by constructive interference based on a distance between the anode 150 and the cathode 170A, that is, a distance between a portion where a reflection occurs on the anode 150 and a portion where a reflection occurs on the cathode 170A. In this specification, the distance between the anode 150 and the cathode 170A is defined as a distance between the reflective layers 151B, 152B, 153B, and 154B of the anode 150 and the cathode 170A corresponding to a semi-transparent layer for convenience of description.

Since wavelengths of red visible light, green visible light, and blue visible light are different from one another, different resonance distances are set in the red subpixel region, the green subpixel region, and the blue subpixel region. A resonance distance may be set to a value corresponding to a multiple of a half wave length of emitted light. When a resonance distance for light having a predetermined wavelength is formed, light having the corresponding wavelength of emitted light is repeatedly reflected between the anode 150 and the cathode 170A, and is extracted outward with an increased amplitude due to constructive interference and thus, a light efficiency is enhanced. Whereas, light not having the corresponding wavelength has a decreased amplitude due to destructive interference when being repeatedly reflected between the anode 150 and the cathode 170A. For example, since a wavelength of red visible light is about 650 nm, a resonance distance in the first subpixel region 110A corresponding to the red subpixel region may be set to a multiple of about 325 nm. Further, since a wavelength of green visible light is about 530 nm, a resonance distance in the second subpixel region 110B corresponding to the green subpixel region may be set to a multiple of about 265 nm. Further, since a wavelength of blue visible light is about 470 nm, a resonance distance in the third subpixel region 110C corresponding to the blue subpixel region may be set to a multiple of about 235 nm.

A thickness of the anode 150 positioned in each subpixel region may be differently adjusted to differently set the resonance distance described above for each subpixel region. The transparent conductive layers 151A, 152A, 153A, and 154A of the anode 150, and the organic emission layer 160 are positioned between the reflective layers 151B, 152B, 153B, and 154B corresponding to a portion where a reflection mainly occurs on the anode 150, and a lower surface of the cathode 170A corresponding to a portion where a reflection mainly occurs on the cathode 170A. Herein, a thickness of the organic emission layer 160 emitting white light is the same in all subpixel regions. Thus, thicknesses of the transparent conductive layers 151A, 152A, 153A, and 154A of the anode 150 positioned in the respective subpixel regions may be set to different values to set a distance between the anode 150 and the cathode 170A differently for each subpixel region. Specifically, since a resonance distance in the first subpixel region 110A is about 325 nm, a resonance distance in the second subpixel region 110B is about 265 nm, and a resonance distance in the third subpixel region 110C is about 235 nm, a thickness of the transparent conductive layer 151A of the first anode 151 positioned in the first subpixel region 110A may be greater than a thickness of the transparent conductive layer 152A of the second anode 152 positioned in the second subpixel region 110B, and a thickness of the transparent conductive layer 152A of the second anode 152 positioned in the second subpixel region 110B may be greater than a thickness of the transparent conductive layer 153A of the third anode 153 positioned in the third subpixel region 110C. That is, as illustrated in FIG. 1a, when thicknesses of the reflective layers 151B, 152B, and 153B disposed in the first anode 151, the second anode 152, and the third anode 153, respectively, are the same, thicknesses of the first anode 151, the second anode 152, and the third anode 153 may be set by differently setting thicknesses of the transparent conductive layers 151A, 152A, and 153A disposed in the first anode 151, the second anode 152, and the third anode 153, respectively.

The fourth subpixel region 110D is a white subpixel region, and is a region in which the color filter 190 is not formed unlike the first subpixel region 110A, the second subpixel region 110B, and the third subpixel region 110C. Thus, a micro-cavity may not be formed in the fourth subpixel region 110D. When a micro-cavity is formed, white light emitted from the organic emission layer 160 corresponds to a color expressed by light having a predetermined wavelength undergoing constructive interference by the micro-cavity, and a color shift may occur. However, since a metal layer is used as the cathode 170A to decrease a work function of the cathode 170A even though the metal layer is significantly thin, the cathode 170A functions as a semi-transparent layer. Further, since the cathode 170A is formed over the entire surface of the organic emission layer 160, the micro-cavity is generated by the cathode 170A functioning as a semi-transparent layer in the fourth subpixel region 110D. In addition, even when the cathode 170A is significantly thinly formed, for example, a thickness of the cathode 170A is set to about 150 Å to increase a light transmittance of the cathode 170A, a reduction in power consumption and an enhancement of a luminance by the fourth subpixel region 110D may be small since a light transmittance of the cathode 170A is merely about 30% to 50%. Therefore, it is significantly difficult to form a micro-cavity in the red subpixel region, the green subpixel region, and the blue subpixel region by additionally forming the white subpixel region in the top emission type organic light emitting display.

In the organic light emitting display 100 according to embodiments of the invention, the cathode 170A formed on the organic emission layer 160 includes a first region 171A having a first light transmittance and a second region 172A having a second light transmittance greater than the first light transmittance. Herein, a light transmittance is a value indicating a degree at which a predetermined material transmits light, refers to an average transmittance for each wavelength in a visible light wavelength region, and may be measured in various schemes. The first region 171A of the cathode 170A is a region in which a micro-cavity is formed, corresponds to a plurality of subpixel regions, that is, the first subpixel region 110A, the second subpixel region 110B, and the third subpixel region 110C, and may correspond to a region in which the color filter 190 is disposed. In addition, the second region 172A of the cathode 170A is a region formed to minimize occurrence of a micro-cavity, corresponds to a single subpixel region, that is, the fourth subpixel region 110D, and may correspond to a region in which the color filter 190 is not disposed.

A reflection decreasing layer 180A is formed on at least a portion of the cathode 170A so that the second light transmittance of the second region 172A of the cathode 170A is greater than the first second light transmittance first region 171A of the cathode 170A.

Figure 1B:
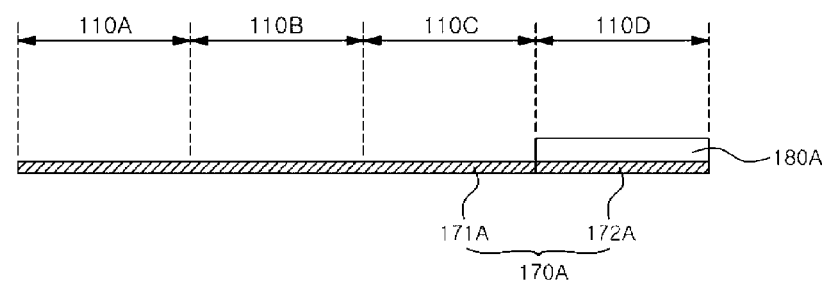

FIG. 1b is a conceptual diagram illustrating the cathode and the reflection decreasing layer of the organic light emitting display illustrated in FIG. 1a. FIG. 1b illustrates the cathode 170A and the reflection decreasing layer 180A of the organic light emitting display 100 illustrated in FIG. 1a for convenience of description.

Referring to FIGS. 1a and 1b, the reflection decreasing layer 180A is formed on the cathode 170A in at least a portion of the cathode 170A. A portion of the cathode 170A coming into contact with the reflection decreasing layer 180A has a smaller reflectance when compared to a portion of the cathode 170A not coming into contact with the reflection decreasing layer 180A. The reflection decreasing layer 180A is formed using a material capable of reducing the reflection of the organic emission layer generated light by the cathode 170A and reduce micro-cavity effect in the specific part of the organic light emitting device. For example, a material such as an organic matter and an oxide may be used as the reflection decreasing layer 180A. In particular, a positive oxide may be used as the oxide. Specifically, molybdenum oxide ($MoO_3$), a silicon nitride ($SiN_x$), a silicon oxide ($SiO_2$), indium zinc oxide (IZO), and the like may be used as the reflection decreasing layer 180A. For example, the reflection decreasing layer 180A may be formed by an organic material using a mask, or may be printed using a nozzle and the like.

A thickness of the reflection decreasing layer 180A may be greater than a thickness of the cathode 170A. The thickness of the reflection decreasing layer 180A may be set to a value greater than or equal to about two times the thickness of the cathode 170A. As described above, when the thickness of the cathode 170A about 100 Å to 200 Å, the thickness of the reflection decreasing layer 180A may be set to about 200 Å to 400 Å. For instance, when the cathode 170A is about 150 Å, the reflection decreasing layer 180A can be about 300 Å.

Referring to FIGS. 1a and 1b, the reflection decreasing layer 180A may be formed in at least a portion of the cathode 170A, and the portion is the fourth subpixel region 110D corresponding to the white subpixel region. The reflection decreasing layer 180A is formed in at least a portion of an upper surface of the cathode 170A. As described above, since the cathode 170A functions as a semi-transparent layer in the top emission type organic light emitting display 100, a light transmittance of the cathode 170A is merely about 30% to 50% in the white subpixel region. Therefore, a light transmittance of the cathode is needed to be enhanced by decreasing an amount of light reflected by the cathode in the white subpixel region for reducing power consumption and enhancing a luminance, and traveling toward the anode. Thus, when the reflection decreasing layer 180A described above is formed in the second region 172A of the cathode 170A corresponding to the fourth subpixel region 110D which is the white subpixel region, a light transmittance may be increased by decreasing a reflectance in a portion of the cathode 170A corresponding to the fourth subpixel region 110D.

In the organic light emitting display 100 according to embodiments of the invention, a reflectance of the second region 172A of the cathode 170A may be decreased by forming the reflection decreasing layer 180A in the second region 172A of the cathode 170A corresponding to the fourth subpixel region 110D which is the white subpixel region. As a reflectance of the second region 172A of the cathode 170A decreases, a light transmittance of the second region 172A of the cathode 170A increases. Thus, an amount of light reflected on the cathode 170A, and traveling toward the anode 150 of white light emitted from the organic emission layer 160 formed in the fourth subpixel region 110D decreases. Accordingly, it is possible to minimize a micro-cavity that may be generated in the fourth subpixel region 110D, and minimize a color shift of white light that may occur in the fourth subpixel region 110D.

Referring to FIG. 1a, a thickness of the fourth anode 154 positioned in the fourth subpixel region 110D may be the same as a thickness of one of the first anode 151, the second anode 152, and the third anode 153. For example, when the thickness of the fourth anode 154 is the same as a thickness of the third anode 153 as illustrated in FIG. 1a, the fourth anode 154 may be similarly formed in a process of forming the third anode 153. In description with reference to FIG. 1a, the first subpixel region 110A corresponds to the red subpixel region, the second subpixel region 110B corresponds to the green subpixel region, and the third subpixel region 110C corresponds to the blue subpixel region. However, a color of each subpixel region may be changed.

In this specification, the anode 150 is defined to include the transparent conductive layers 151A, 152A, 153A, and 154A, and the reflective layers 151B, 152B, 153B, and 154B. However, the anode 150 may include the transparent conductive layers 151A, 152A, 153A, and 154A, and the reflective layers 151B, 152B, 153B, and 154B may correspond to a separate configuration. Further, in this specification, the anode 150 includes a transparent conductive material having a high work function, and a reflective metal layer. However, the anode 150 may be formed using a conductive material having a high work function, and excellent in a reflectance.

In several embodiments, at least a portion of the first anode 151, the second anode 152, and the third anode 153 may have the same thickness. As described above, thicknesses of the first anode 151, the second anode 152, and the third anode 153 may be different from one another to form a micro-cavity. However, the organic light emitting display 100 may be designed in a configuration in which light having a predetermined wavelength is amplified. Therefore, for example, the first anode 151 and the second anode 152 may be formed to have the same thickness, and the third anode 153 may be formed to have a thickness less than or greater than thicknesses of the first anode 151 and the second anode 152.

In this specification, the fourth anode 154 and the third anode 153 have the same thickness for convenience of description. However, the invention is not limited thereto, and the fourth anode 154 may have the same thickness as a thickness of the first anode 151 or the second anode 152.

FIGS. 1c to 1f are conceptual diagrams illustrating various positions and thicknesses of a reflection decreasing layer of the organic light emitting display illustrated in FIG. 1a. FIGS. 1c to 1f illustrate cathodes 170C, 170D, 170E, and 170F, and reflection decreasing layers 180C, 180D, 180E, and 180F for convenience of description. FIGS. 1c to 1f have substantially the same configuration as a configuration of FIG. 1b except for a position and a thickness of the reflection decreasing layers 180C, 180D, 180E, and 180F. Thus, repeated description is omitted.

Figure 1C:
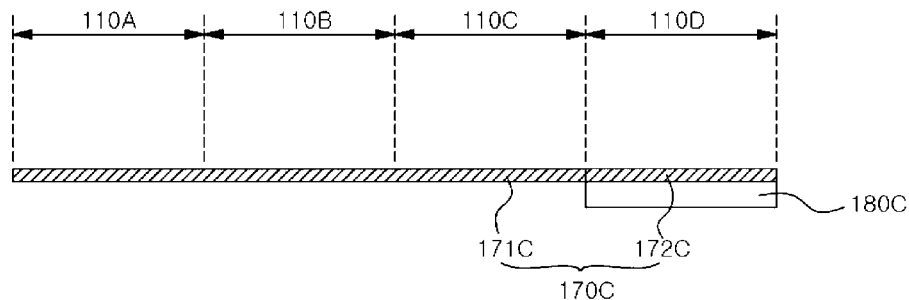

First, referring to FIG. 1c, the reflection decreasing layer 180C is formed on a lower surface of the cathode 170C corresponding to the fourth subpixel region 110D which is the white subpixel region. The reflection decreasing layer 180C may be formed on the lower surface of the cathode 170C to decrease a reflectance in a second region 172C of the cathode 170C corresponding to the fourth subpixel region 110D.

A thickness of the reflection decreasing layer 180C may be set to a thickness enabling an electron supplied from the cathode 170A to move to an organic emission layer. When the reflection decreasing layer 180C is formed on the lower surface of the cathode 170C to decrease a reflectance in the cathode 170C, an electron from the cathode 170C may not smoothly move to the organic emission layer due to the reflection decreasing layer 180C. Thus, it is possible to allow an electron to move from the cathode 170C to the organic emission layer by forming the reflection decreasing layer 180C to have a thickness less than or equal to about 400 Å.

Figure 1D:
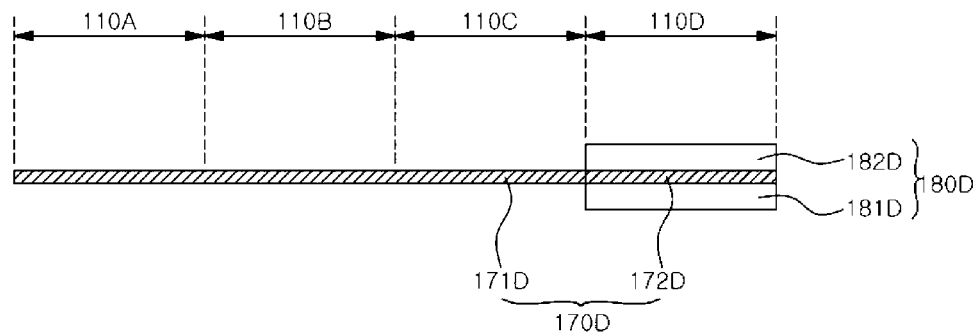

Subsequently, referring to FIG. 1d, the reflection decreasing layer 180D includes a lower reflection decreasing layer 181D formed on at least a portion of a lower surface of the cathode 170D, and an upper reflection decreasing layer 182D formed on at least a portion of an upper surface of the cathode 170D. The portion of the cathode 170D described above corresponds to a second region 172D excluding a first region 171D.

The lower reflection decreasing layer 181D and the upper reflection decreasing layer 182D are formed using a material that can reduce the reflection of the light from the organic emission layer by the cathode 170D. For example, a material such as an organic matter and an oxide may be used as the lower reflection decreasing layer 181D and the upper reflection decreasing layer 182D. In particular, a positive oxide may be used as the oxide. Specifically, $MoO_3$, $SiN_x$, $SiO_2$, IZO, and the like may be used as the lower reflection decreasing layer 181D and the upper reflection decreasing layer 182D. The lower reflection decreasing layer 181D and the upper reflection decreasing layer 182D have the same thickness. The lower reflection decreasing layer 181D and the upper reflection decreasing layer 182D may be formed to have the same thickness of about 300 Å to 400 Å. The lower reflection decreasing layer 181D and the upper reflection decreasing layer 182D may be formed on the upper surface and the lower surface of the cathode 170D to decrease a reflectance of the second region 172D of the cathode 170D.

Figure 1E:
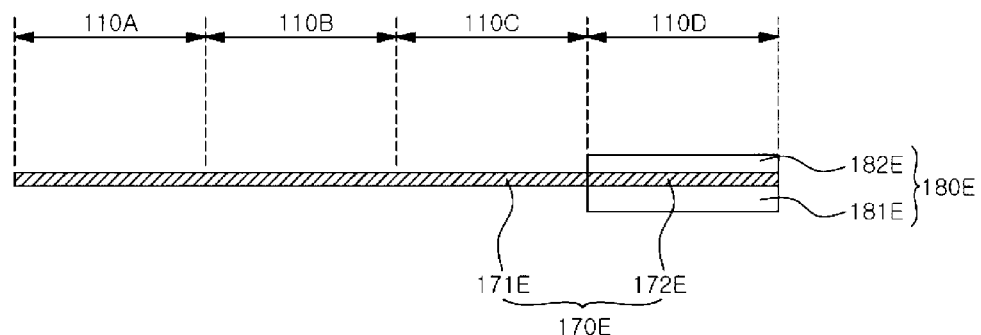

Subsequently, referring to FIG. 1e, thicknesses of a lower reflection decreasing layer 181E and an upper reflection decreasing layer 182E are different from each other, and the thickness of the lower reflection decreasing layer 181E is greater than the thickness of the upper reflection decreasing layer 182E. The lower reflection decreasing layer 181E and the upper reflection decreasing layer 182E may be formed to have a thickness of about 300 Å to 400 Å. FIG. 1e illustrates that the thickness of the lower reflection decreasing layer 181E is greater than the thickness of the upper reflection decreasing layer 182E. However, the thickness of the lower reflection decreasing layer 181E may be less than the thickness of the upper reflection decreasing layer 182E.

Figure 1F:
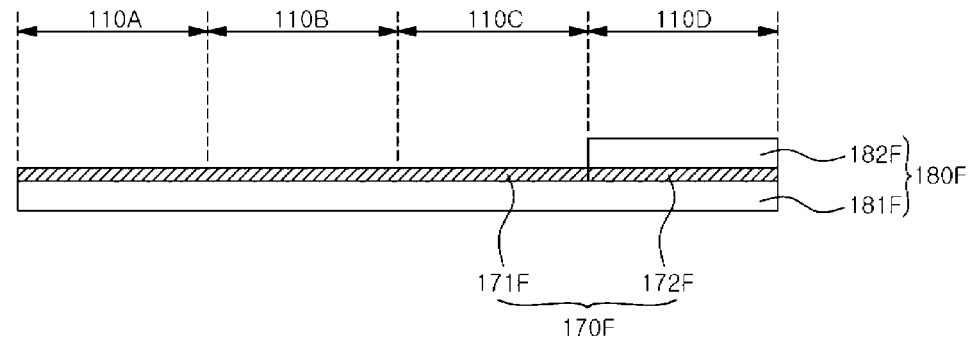

Subsequently, referring to FIG. 1f, a lower reflection decreasing layer 181F is formed on the entire lower surface including at least a portion of a cathode 170F, and an upper reflection decreasing layer 182F is formed on an upper surface of at least a portion of the cathode 170F. For example, the lower reflection decreasing layer 181F may be formed on lower surfaces of a first region 171F and a second region 172F of the cathode, and the upper reflection decreasing layer 182F may be formed on an upper surface of the second region 172F of the cathode, that is, a fourth subpixel region 110D corresponding to a white subpixel region.

Figure 2A:
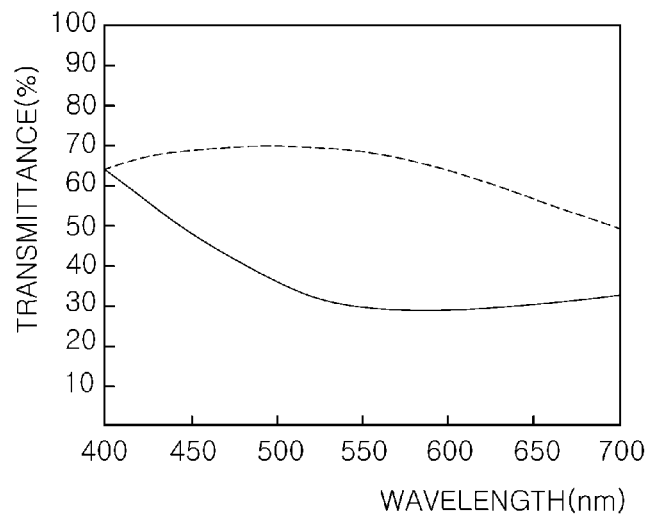
FIGS. 2a and 2b are graphs illustrating a light transmittance of an organic light emitting display according to various embodiments of the invention.
Figure 2B:
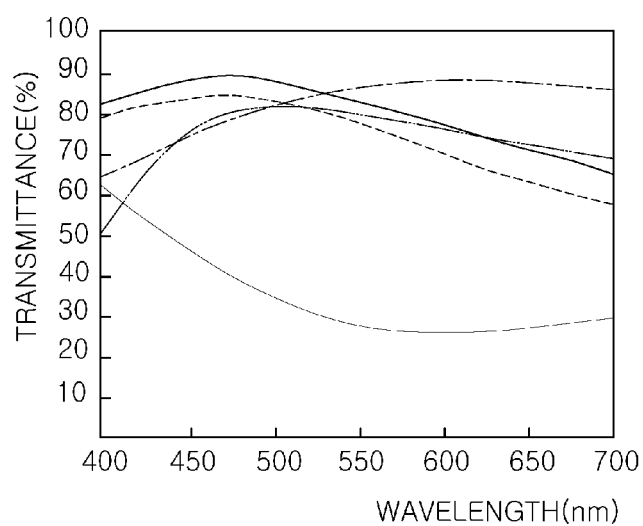

FIGS. 2a and 2b are graphs illustrating a light transmittance of an organic light emitting display according to various embodiments of the invention.

In the graph illustrated in FIG. 2a, an x-axis corresponds to a wavelength, a y-axis corresponds to a transmittance, a unit of a wavelength is nm, and a transmittance is a percentage value. A curve of a solid line in the graph illustrated in FIG. 2a depicts a light transmittance with respect to a wavelength when a cathode is formed using Ag having a thickness of 150 Å, and a curve of a dotted line in the graph illustrated in FIG. 2a depicts a light transmittance with respect to a wavelength when a cathode is formed using Ag having a thickness of 150 Å, and IZO corresponding to a positive oxide having a thickness of 300 Å is formed on a surface of the cathode.

In the graph illustrated in FIG. 2b, an x-axis corresponds to a wavelength, a y-axis corresponds to a transmittance, a unit of a wavelength is nm, and a transmittance is a percentage value. A curve of a thin solid line in the graph illustrated in FIG. 2b depicts a light transmittance with respect to a wavelength when a cathode is formed using Ag having a thickness of 150 Å, a curve of a dotted line in the graph illustrated in FIG. 2b depicts a light transmittance with respect to a wavelength when a cathode is formed using Ag having a thickness of 150 Å, and $MoO_3$ having a thickness of 400 Å is formed on an upper surface and a lower surface of the cathode, a curve of a two dotted line in the graph illustrated in FIG. 2b depicts a light transmittance with respect to a wavelength when a cathode is formed using Ag having a thickness of 150 Å, $MoO_3$ having a thickness of 400 Å is formed on a lower surface of the cathode, and IZO having a thickness of 400 Å is formed on an upper surface of the cathode, a curve of a dashed line in the graph illustrated in FIG. 2b depicts a light transmittance with respect to a wavelength when a cathode is formed using Ag having a thickness of 150 Å, copper phthalocyanine (CuPc) having a thickness of 400 Å is formed on a lower surface of the cathode, and IZO having a thickness of 400 Å is formed on an upper surface of the cathode, and a curve of a thick solid line in the graph illustrated in FIG. 2b depicts a light transmittance with respect to a wavelength when a cathode is formed using Ag having a thickness of 150 Å, CuPc having a thickness of 400 Å is formed on a lower surface of the cathode, and IZO having a thickness of 300 Å is formed on an upper surface of the cathode.

First, referring to FIG. 2a, when a light transmittance of a cathode without a separate reflection decreasing layer is measured (the solid line in the graph of FIG. 2a), a light transmittance of about 30% to 50% on average was measured. Whereas, when IZO is formed as a reflection decreasing layer on a surface of the cathode, and a light transmittance is measured (the dotted line in the graph of FIG. 2a), a light transmittance of about 60% to 80% on average was measured.

Subsequently, referring to FIG. 2b, when a light transmittance of a cathode without a separate reflection decreasing layer is measured (the thin solid line in the graph of FIG. 2b), a light transmittance of about 30% to 50% on average was measured. Whereas, in various cases in which a reflection decreasing layer is formed on both surfaces of the cathode, and a light transmittance is measured (the dotted line, the two dotted line, the dashed line, and the thick solid line in the graph of FIG. 2b), a light transmittance of about 60% to 80% on average was measured.

Figure 3A:
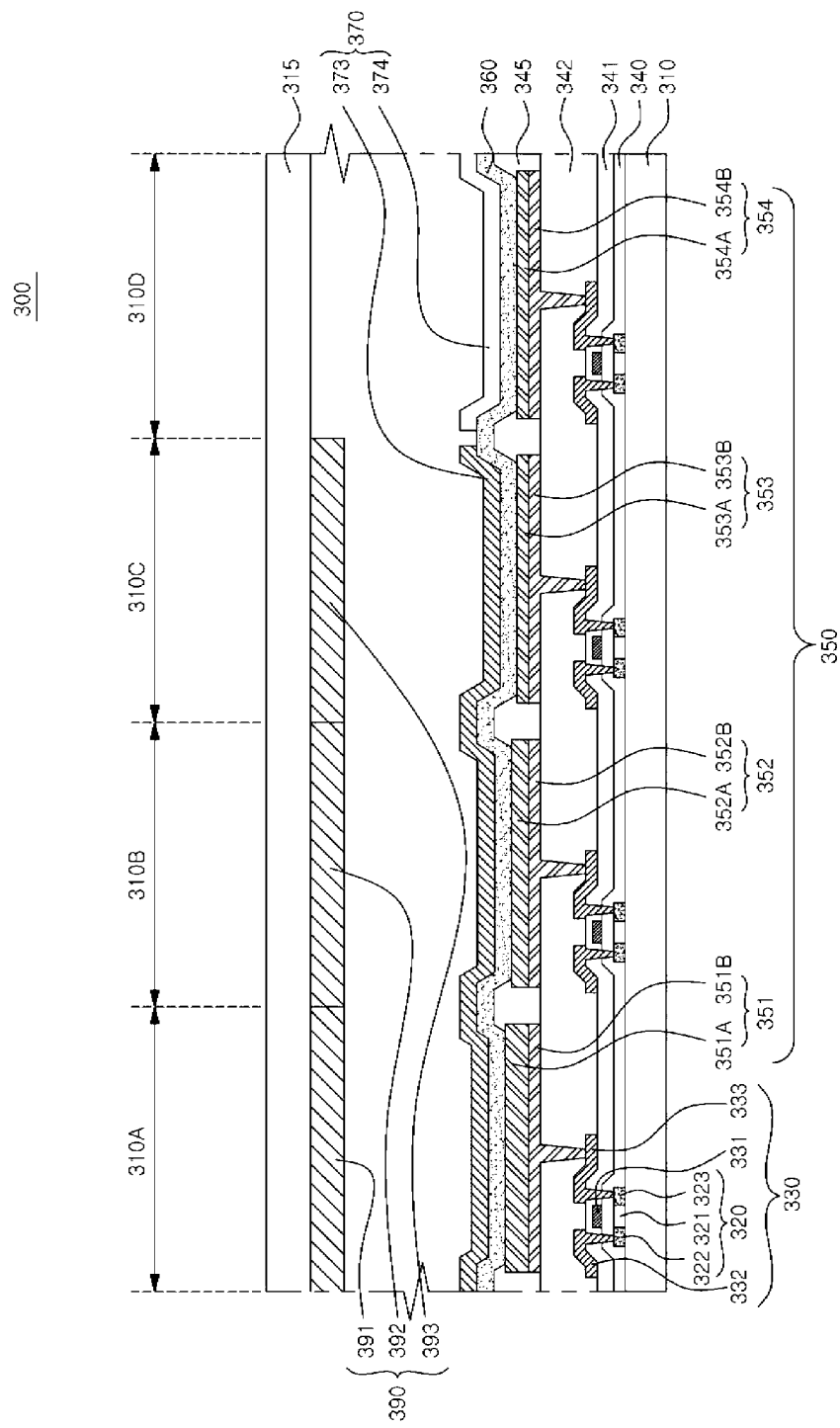
FIG. 3a is a cross-sectional view of a top emission type organic light emitting display including a cathode that includes a plurality of electrodes according to embodiments of the invention.

FIG. 3a is a cross-sectional view of an organic light emitting display including a cathode that includes a plurality of electrodes according to embodiments of the invention. FIG. 3a has substantially the same configuration as a configuration of FIG. 1a except that a cathode 370 includes a second electrode 373 and a third electrode 374. Thus, repeated description is omitted.

An organic light emitting element includes anodes 351, 352, 353, and 354, an organic emission layer 360, and the cathode 370. In this specification, the anodes 351, 352, 353, and 354 are defined as a first electrode.

The second electrode 373 and the third electrode 374 are formed on the organic emission layer 360. The second electrode 373 is formed at a position corresponding to a first subpixel region 310A, a second subpixel region 310B, and a third subpixel region 310C in which a color filter 390 is formed, the third electrode 374 is formed at a position corresponding to a fourth subpixel region 310D in which the color filter 390 is not formed, and the second electrode 373 and the third electrode 374 are formed on the same plane on the organic emission layer 360. The second electrode 373 and the third electrode 374 are electrically connected to each other to form the cathode 370.

The second electrode 373 is formed using a material included in the cathode 370 and having a high electrical conductivity and a low work function, that is, a material for a cathode. As illustrated in FIG. 3a, when an organic light emitting display 300 is the top emission type organic light emitting display, the cathode may be formed using a significantly thin metallic material having a low work function. For example, when the second electrode 373 is formed using a metallic material having a low work function, the second electrode 373 may be formed by a metallic material such as Ag, Ti, Al, Mo, or an alloy of Ag and Mg at a thickness of several hundred Å or less, for example, 150 Å or less. Thus, the second electrode 373 functions as a semi-transparent layer.

The third electrode 374 is formed using a material included in the cathode 370 and having a high electrical conductivity and a low work function, that is, a material for a cathode. The third electrode 374 may be formed using a conductive material having a low work function, and having a high light transmittance when compared to the second electrode 373. Thus, the third electrode 374 may function as a transparent layer, or function as a semi-transparent layer having a higher light transmittance when compared to the second electrode 373.

A light transmittance of the second electrode 373 is different from a light transmittance of the third electrode 374. The third electrode 374 may include a transparent conductive material, or function as a semi-transparent layer having a higher light transmittance than a light transmittance of the second electrode 373 and thus, a light transmittance of the third electrode 374 may be greater than a light transmittance of the second electrode 373. Therefore, a light transmittance of a white subpixel region may be increased while forming a micro-cavity in a red subpixel region, a green subpixel region, and a blue subpixel region.

In several embodiments, the third electrode 374 may be formed in a portion of the fourth subpixel region 310D, and the second electrode 373 may be formed in a region in which the third electrode 374 is not formed among the first subpixel region 310A, the second subpixel region 310B, the third subpixel region 310C, and the fourth subpixel region 310D. Thus, a light transmittance of the fourth subpixel region 310D may be greater than a light transmittance of the first subpixel region 310A, the second subpixel region 310B, and the third subpixel region 310C.

Figure 3B:
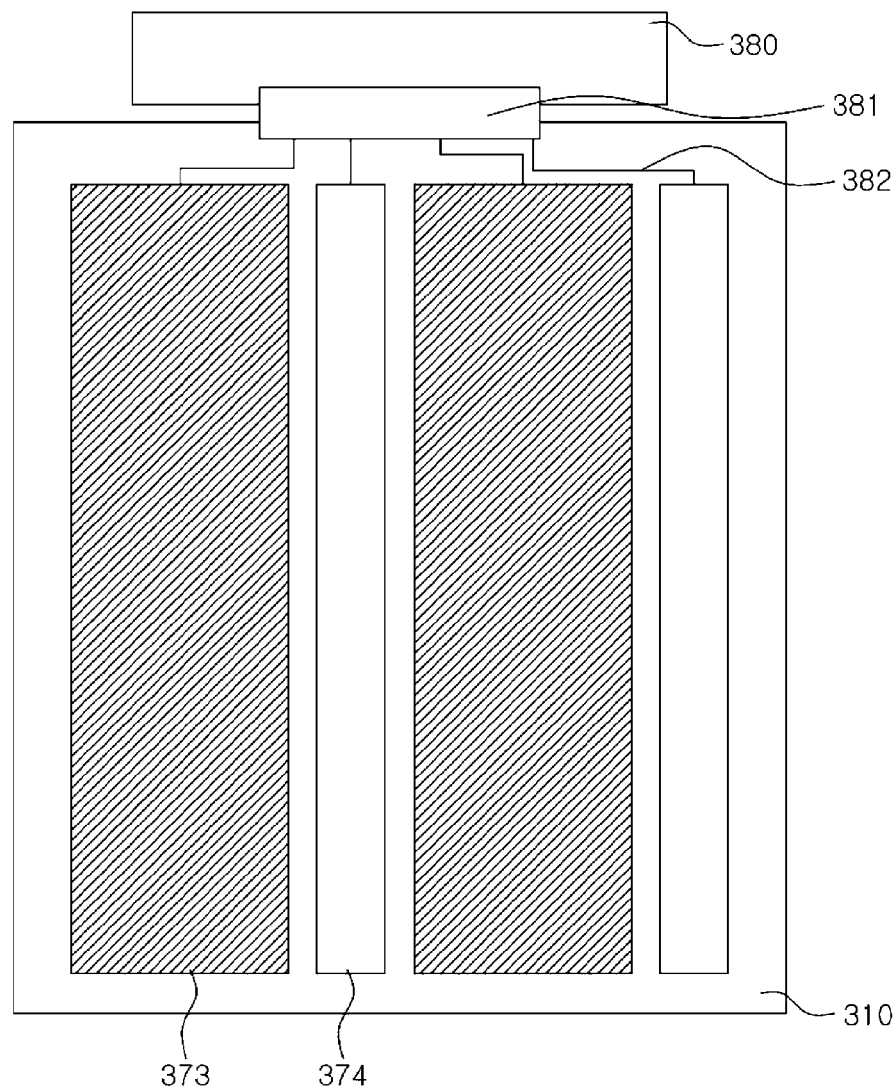

FIG. 3b is a conceptual diagram describing the organic light emitting display illustrated in FIG. 3a.

Referring to FIG. 3b, a pad part 381 for an electric connection to a flexible circuit board 380 on which a chip and a circuit transferring various signals from the outside to a display are mounted is formed on a lower substrate 310, and a wire 382 for transferring various signals from the flexible circuit board 380 is formed on the lower substrate 310. Since both the second electrode 373 and the third electrode 374 are electrodes included in the cathode 370, the second electrode 373 and the third electrode 374 may be connected to the pad part 381, and the same voltage may be applied to the second electrode 373 and the third electrode 374 from the pad part 381.

Figure 4:
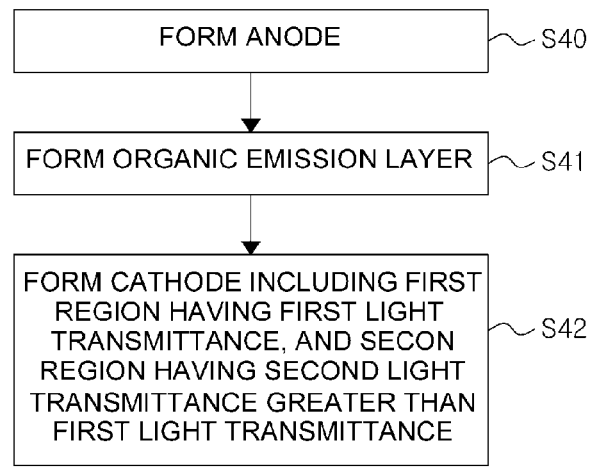
FIG. 4 is a flowchart illustrating a method of manufacturing the organic light emitting display according to embodiments of the invention.

FIG. 4 is a flowchart illustrating a method of manufacturing the organic light emitting display according to embodiments of the invention.

First, an anode is formed on a lower substrate in S40, and an organic emission layer is formed on the anode in S41. Forming of the anode, and forming of the organic emission layer are substantially the same as forming of the anode and the organic emission layer of FIGS. 1 to 3. Thus, repeated description is omitted.

Subsequently, a cathode including a first region having a first light transmittance and a second region having a second light transmittance greater than the first light transmittance is formed on the organic emission layer in S42.

Forming of the cathode may include forming a metal electrode including metal in the first region and the second region, and forming a reflection decreasing layer having a different optical property from an optical property of the metal electrode on a surface of the metal electrode corresponding to the second region.

Forming of the cathode may include forming a metal electrode including metal in the first region, and forming a transparent electrode including a transparent conductive material in the second region.

Hereinafter, various characteristics of the organic light emitting device using a reflection decreasing layer to decrease a reflectance of a cathode with respect to light emitted from an organic emission layer according to an embodiment of the invention will be described.

According to another characteristic of the present invention, the anode has a different thickness in the red, green and blue subpixel regions.

According to still another characteristic of the present invention, the anode in the white sub pixel region has substantially the same thickness as the anode in one of the red, green and blue subpixel regions.

According to still another characteristic of the present invention, the reflection decreasing layer is formed on an upper surface, a lower surface, or both the upper and lower surfaces of the part of the cathode corresponding to the white subpixel region.

According to still another characteristic of the present invention, the reflection decreasing layer includes one or more of molybdenum oxide ($MoO_3$), a silicon nitride ($SiN_x$), a silicon oxide ($SiO_2$) and indium zinc oxide (IZO).

According to still another characteristic of the present invention, the reflection decreasing layer includes an organic material.

According to still another characteristic of the present invention, wherein the anode includes a reflective metal layer and a transparent conductive oxide layer.

According to still another characteristic of the present invention, a thickness of the reflection decreasing layer is greater than a thickness of the cathode.

According to still another characteristic of the present invention, the cathode is formed of Ag with a thickness of about 100 Å to 200 Å, and wherein the reflection decreasing layer is formed of IZO with a thickness of about 200 Å to 400 Å.

According to still another characteristic of the present invention, the cathode is formed of Ag with a thickness of about 100 Å to 200 Å, and wherein the reflection decreasing layer is formed of $MoO_3$ with a thickness of about 200 Å to 400 Å.

According to still another characteristic of the present invention, wherein a first reflection decreasing layer is formed on an upper surface and a second reflection decreasing layer is formed on a lower surface of the cathode corresponding to the white subpixel region, the first and second reflection decreasing layers having a different thickness from each other.

Hereinafter, various characteristics of the organic light emitting device including a plurality of cathodes having different light transmittances according to an embodiment of the invention will be described.

According to another characteristic of the present invention, the first part of the organic emission layer corresponds to at least one of a red subpixel region, a green subpixel region and a blue subpixel region, and wherein the second part of the organic emission layer corresponds to a white subpixel region.

According to still another characteristic of the present invention, the second electrode and the third electrode are formed on the same plane.

According to still another characteristic of the present invention, the second electrode and the third electrode are electrically connected to each other to form a cathode.

According to still another characteristic of the present invention, the second electrode is formed of a metal alloy, and wherein the third electrode is formed of a transparent conductive oxide material.

According to still another characteristic of the present invention, the second electrode is formed of MgAg and the third electrode is formed of IZO.

Hereinafter, various characteristics of a method of manufacturing the organic light emitting device according to an embodiment of the invention will be described.

According to another characteristic of the present invention, the step for forming a cathode and a reflection decreasing layer comprises forming a first reflection reduction layer on the organic emission layer corresponding to the second part of the organic light emitting device and forming the cathode on the organic emission layer and the reflection decreasing layer.

According to still another characteristic of the present invention, the method comprises forming a second reflection decreasing layer on the cathode corresponding to the second part of the organic light emitting device.

The exemplary embodiments of the present invention have been described in more detail with reference to the accompanying drawings, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical spirits within a scope equivalent thereto are included in the appended claims of the present invention.

The invention claimed is:

1. An organic light emitting device with red, green, blue and white subpixel regions, comprising:
   a lower substrate;
   an anode formed on the lower substrate;
   an organic emission layer formed on the anode, the organic emission layer emitting white light;
   a cathode formed on the organic emission layer; and
   a reflection decreasing layer formed on a part of the cathode corresponding to the white subpixel region for reducing reflection of the light emitted from the organic emission layer by the cathode at the white subpixel region, wherein the reflection decreasing layer includes a first reflection decreasing layer and a second reflection decreasing layer, and wherein the first reflection decreasing layer is formed on an upper surface of the cathode and the second reflection decreasing layer is formed on a lower surface of the cathode corresponding to the white subpixel region.

2. The organic light emitting device according to claim 1, wherein the anode in the white subpixel region has substantially the same thickness as the anode in one of the red, green and blue subpixel regions.

3. The organic light emitting device according to claim 1, wherein the reflection decreasing layer includes one or more of molybdenum oxide (MoO3), a silicon nitride (SiNx), a silicon oxide (SiO2) and indium zinc oxide (IZO).

4. The organic light emitting device according to claim 1, wherein the reflection decreasing layer includes an organic material.

5. The organic light emitting device according to claim 1, wherein the anode includes a reflective metal layer and a transparent conductive oxide layer.

6. The organic light emitting device according to claim 5, wherein a thickness of the reflection decreasing layer is greater than a thickness of the cathode.

7. The organic light emitting device according to claim 6, wherein the cathode is formed of Ag with a thickness of about 100 Å to 200 Å, and wherein the reflection decreasing layer is formed of IZO with a thickness of about 200 Å to 400 Å.

8. The organic light emitting device according to claim 6, wherein the cathode is formed of Ag with a thickness of about 100 Å to 200 Å, and wherein the reflection decreasing layer is formed of MoO3 with a thickness of about 200 Å to 400 Å.

9. The organic light emitting device according to claim 1, wherein the first and second reflection decreasing layers have a different thickness from each other.

10. A top emission type of organic light emitting device with red, green, blue and white subpixel regions, comprising:
   a substrate comprising a thin film transistor (TFT) in each subpixel region;
   an anode on the substrate;
   an organic emission layer on the anode, the organic emission layer emitting white light;
   a cathode on the organic emission layer; and
   a reflection decreasing layer on a part of the cathode corresponding to the white subpixel region for increasing a light transmittance of the cathode at the white subpixel region,
   wherein the reflection decreasing layer includes a first reflection decreasing layer and a second reflection decreasing layer, and
   wherein the first reflection decreasing layer is formed on an upper surface of the cathode and the second reflection decreasing layer is formed on a lower surface of the cathode corresponding to the white subpixel region.

11. A top emission type of organic light emitting device according to claim 10, wherein the reflection decreasing layer is configured to reduce reflection of the white light emitted from the organic emission layer by the part of the cathode.

12. A top emission type of organic light emitting device according to claim 10, wherein the reflection decreasing layer is configured to minimize occurrence of a micro-cavity between the anode and the cathode correspond to the white subpixel region.

13. A top emission type of organic light emitting device according to claim 10, wherein the cathode is a semi-transparent layer for emitting the white light emitted from the organic emission layer to the top surface of the cathode.

14. A top emission type of organic light emitting device according to claim 10, wherein the organic emission layer is configured to emit the white light to the cathode.

* * * * *